(12) United States Patent
Klein et al.

(10) Patent No.: US 9,697,889 B1
(45) Date of Patent: Jul. 4, 2017

(54) METHOD AND APPARATUS FOR READ ASSIST TO ACHIEVE ROBUST STATIC RANDOM ACCESS MEMORY (SRAM)

(71) Applicant: Samsung Electronics Co., Ltd., Suwon-si, Gyeonggi-do (KR)

(72) Inventors: Kevin E. Klein, Austin, TX (US); Prashant U. Kenkare, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/143,506

(22) Filed: Apr. 29, 2016

Related U.S. Application Data

(60) Provisional application No. 62/305,509, filed on Mar. 8, 2016.

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
CPC ....... G11C 7/22; G11C 16/0483; G11C 16/10; G11C 11/56; G11C 2211/5641; G11C 7/1006; G11C 7/1051; G11C 7/1063; G11C 8/10; G11C 11/419; G11C 11/5628; G11C 11/5642; G11C 16/30; G11C 16/3418; G11C 16/3454; G11C 16/3459

USPC .... 365/185.03, 185.21, 189.15, 193, 185.27, 365/191, 230.06, 154, 185.11, 185.28, 365/194, 201, 205, 207, 226, 156, 185.18
See application file for complete search history.

(56) References Cited

U.S. PATENT DOCUMENTS

| 5,796,651 A | 8/1998 | Horne et al. |
| 8,611,172 B2 | 12/2013 | Shyanmugam et al. |
| 2013/0094308 A1* | 4/2013 | Yang .................. G11C 8/08 365/191 |
| 2015/0371686 A1 | 12/2015 | Van Winkelhoff et al. |

* cited by examiner

*Primary Examiner* — Thong Q Le
(74) *Attorney, Agent, or Firm* — Renaissance IP Law Group LLP

(57) ABSTRACT

According to one general aspect, an apparatus may include a bit cell configured to store a bit of information. The apparatus may include a first voltage configured to supply the bit cell with power. The apparatus may include a wordline driver configured to cause the bit to be read from the bit cell. The wordline driver may be configured to operate during a read operation at a second voltage that is lower than the first voltage, wherein the second voltage is determined by charge sharing between a plurality of capacitances. The wordline driver may include a switch configured to disconnect the wordline driver from the first voltage before an input word line signal is applied to the wordline driver, and wherein the switch is responsive to a clock signal.

17 Claims, 6 Drawing Sheets

METHOD AND APPARATUS FOR READ ASSIST TO ACHIEVE ROBUST STATIC RANDOM ACCESS MEMORY (SRAM)

CROSS-REFERENCE TO RELATED APPLICATION

This application claims priority under 35 U.S.C. §119 to Provisional Patent Application Ser. No. 62/305,509, entitled "METHOD AND APPARATUS FOR READ ASSIST TO ACHIEVE ROBUST STATIC RANDOM ACCESS MEMORY (SRAM)" filed on Mar. 8, 2016. The subject matter of this earlier filed application is hereby incorporated by reference.

TECHNICAL FIELD

This description relates to memory circuits, and more specifically to adjusting the voltage during a read access to the memory circuit.

BACKGROUND

The memory or bit cell is the fundamental building block of memory. It can be implemented using different technologies, such as bipolar, metal-oxide semiconductor (MOS), and other semiconductor devices. It can also be built from magnetic material such as ferrite cores or magnetic bubbles. Regardless of the implementation technology used, a memory or bit cell generally stores one bit of binary information.

Typically bit cells are arranged into words (e.g., an 8-bit word, 32-bit word, and 128-bit word), and are accessed (read from or written to) in a group. Often a word line will transmit a signal that provides access to or activates the entire word. The information read from or written to the bit cell is transmitted via a bit line that accesses a specific bit of the word. Memory or bit cells are typically arranged in arrays. In these arrays the words are often thoughts of as the rows, and the bits or bit lines are thought of as the columns.

Occasionally a bit cell is susceptible to a type of error known as a read disturb. The susceptibility of bit cells to read disturb errors generally gets worse as transistor parametric variation increases with more aggressive technology scaling. It is well understood that smaller feature sizes have less well-controlled electrical characteristics, and there is a higher statistical probability of non-ideal behavior. A read disturb error occurs when the bit cell is being read from, but the voltages and currents are such that instead of reading from the bit cell in a non-destructive manner, the value stored in the bit cell changes. The voltage applied by the word line is sufficiently high that a high bit value is written into the bit cell, overwriting a properly stored low bit value. Errors such as this are undesirable. Often the likelihood of such an error increases as the rows, words or word size per bit line (or column) increase. This can limit the size of the memory array.

SUMMARY

According to one general aspect, an apparatus may include a bit cell configured to store a bit of information. The apparatus may include a first voltage configured to supply the bit cell with power. The apparatus may include a wordline driver configured to cause the bit to be read from the bit cell. The wordline driver may be configured to operate during a read operation at a second voltage that is lower than the first voltage, wherein the second voltage is determined by charge sharing between a plurality of capacitances. The wordline driver may include a switch configured to disconnect the wordline driver from the first voltage before an input word line signal is applied to the wordline driver, and wherein the switch is responsive to a clock signal.

According to another general aspect, a method may include storing a bit of information within a bit cell at a first voltage. The method may include disconnecting, responsive to a clock signal, a wordline driver associated with the bit cell from the first voltage. The method may include activating the wordline driver after the wordline driver has been disconnected from the first voltage, wherein the wordline driver is activated by a second voltage that is less than the first voltage and determined by charge sharing between a plurality of capacitances. The method may further include transmitting, via a pass gate that is responsive to the wordline driver, the bit to a bitline.

According to another general aspect, an apparatus may include a plurality of bit cells each configured to store a respective bit of information. The apparatus may include a first voltage configured to supply the plurality of bit cells with power. The apparatus may further include a wordline driver network. The wordline driver network may include a plurality of wordline drivers each associated with one or more associated bit cells, and each configured to cause the bits stored by the associated bit cells to be output by the associated bit cells, wherein each wordline driver is configured to operate during a read operation at a second voltage that is lower than the first voltage, wherein the second voltage is determined by charge sharing between a plurality of capacitances. The wordline driver network may include a switch configured to disconnect the plurality of wordline drivers from the first voltage before an input word line signal is applied to at least one wordline driver, and wherein the switch is responsive to a clock signal.

The details of one or more implementations are set forth in the accompanying drawings and the description below. Other features will be apparent from the description and drawings, and from the claims.

A system and/or method for memory circuits, and more specifically to adjusting the voltage during a read access to the memory circuit, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
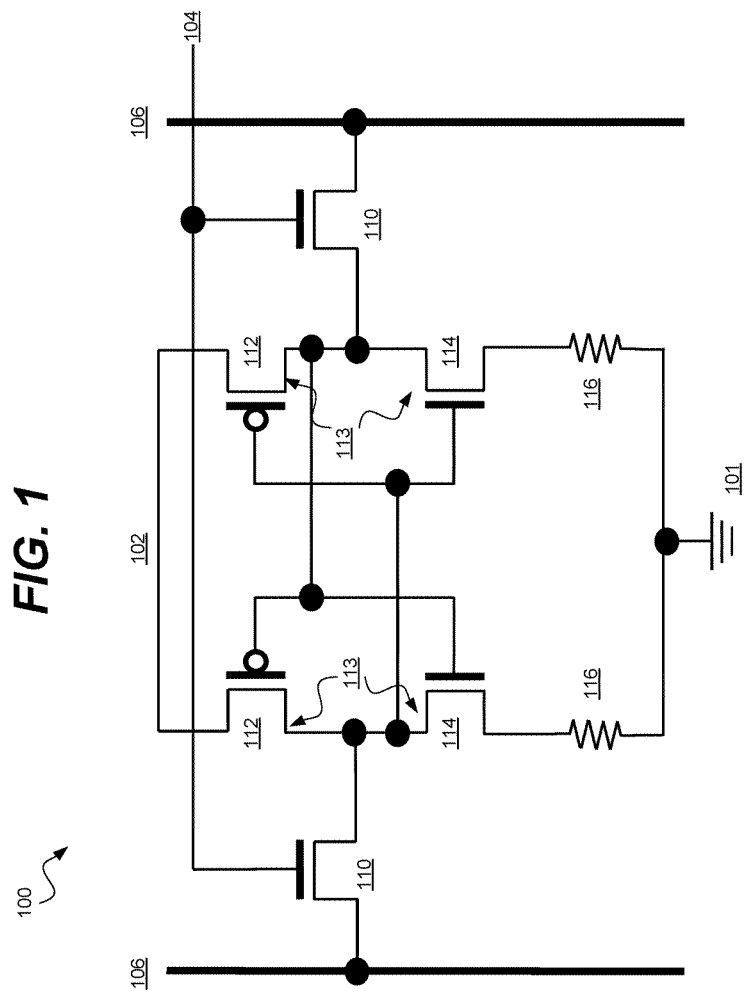
FIG. 1 is a circuit diagram of an example embodiment of an apparatus in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a circuit diagram of an example embodiment of an apparatus or bit cell 100 in accordance with the disclosed subject matter. In the illustrated embodiment, a static random access memory (SRAM) cell is shown. It is understood that the above is merely one illustrative example to which the disclosed subject matter is not limited.

One skilled in the art will understand that the standard SRAM bit cell design (from which the illustrated bit cell 100 derives but is not identical) includes positive and negative, or inverted, halves. For the sake of simplicity elements of both halves will be described using the same numerical identifiers.

In the illustrated embodiment, the bit cell 100 may include two inverters 113, each made up of the transistors 112 & 114. The two inverters may be arranged in a cross-coupled fashion that creates a bi-state circuit. The feedback of this stable circuit may not change over time, unless acted upon by an outside force (e.g., the bitline and wordlines). Thus the inverters 113 may be configured to store a bit of information.

Further, the inverters may be powered by a first voltage source (VDDCE) 102. In the illustrated embodiment, the inverters 113 may be placed in parallel between the voltage source VDDCE 102, the resistors 116, and the low voltage source or ground 101. In various embodiments, the resistors 116 may not be discrete, actual resistors, but rather be representations of the parasitic resistances of the source contacts of the transistors 114.

In the illustrated embodiment, the input/outputs of the inverters 113 may be coupled to the bitlines 106. In various embodiments, a third voltage VDDPE (source not shown) may be employed to power the bitlines 106. In some embodiments, the third voltage VDDPE may be equal to or less than the first voltage VDDCE 102. During a write operation, the bitlines may have a voltage applied to them that may then be written and stored by inverters 113. During a read operation, the voltage of the inverters 113 may be transmitted to the bitlines 106.

In the illustrated embodiment, each bitline 106 is connected with the inverter 113 by a pass gate or transistor 110. When the bit cell 100 is not being accessed (e.g., being read from or written to), the pass gates 110 may remain closed, isolating the inverters 113 from the bitlines 106. When a memory access occurs however, the pass gates 110 may be opened, and the bitlines 106 and inverters 113 may be electrically connected.

In the illustrated embodiment, the pass gates 110 are controlled by the wordlines 104. In a traditional SRAM cell the wordlines 104 would be powered by the first voltage VDDCE 102. As described above, this voltage may be sufficiently high to cause read disturb errors. Therefore, in the illustrated embodiment, the wordlines 104 are powered by a second voltage VDDWL.

In the illustrated embodiment, the second voltage VDDWL may have a maximum voltage less than the first voltage VDDCE 102. In various embodiments, the maximum voltage of VDDWL may be 85-90% of the voltage of the first voltage VDDCE 102. In some embodiments, the voltage drop between the two voltages VDDCE and VDDWL may be approximately 100 millivolts (mV). It is understood that the above are merely a few illustrative examples to which the disclosed subject matter is not limited.

In such an embodiment, the pass gate 110 (when turned on) may be sufficiently weakened so as to not cause a read disturb error. Further, the performance of the bit cell 100 may not be significantly impacted as the relatively high voltage of the second voltage VDDWL may still provide sufficient sense differential.

Figure 2:
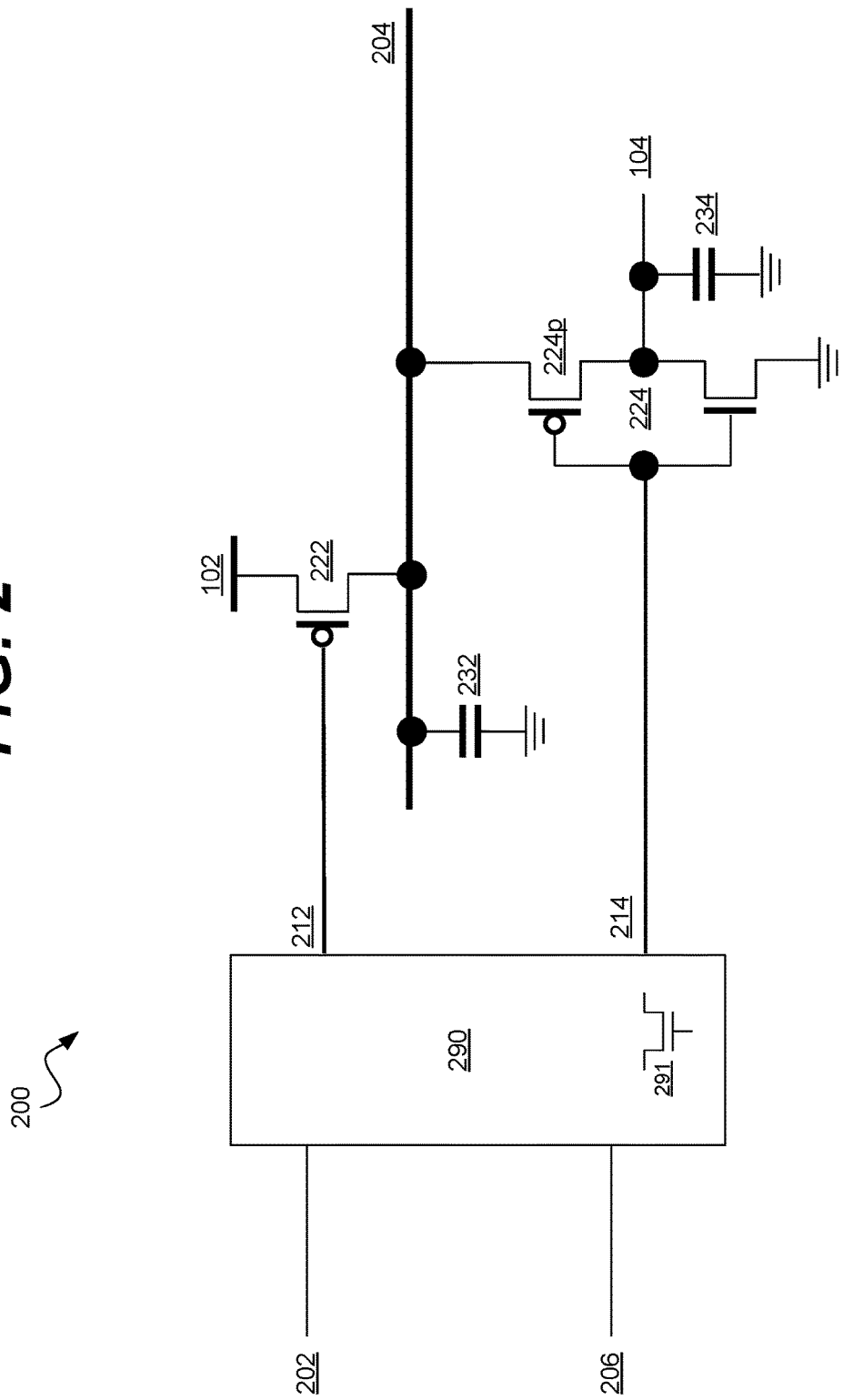
FIG. 2 is a circuit diagram of an example embodiment of an apparatus in accordance with the disclosed subject matter.

FIG. 2 is a circuit diagram of an example embodiment of an apparatus 200 in accordance with the disclosed subject matter. In the illustrated embodiment, the apparatus 200 may include a wordline driver network and the accompanying control logic circuit 290. This wordline driver network may generate the wordline signal(s) that controls the pass gates of the bit cells (e.g., the bit cell 100 of FIG. 1).

In the illustrated embodiment, the wordline 104 may operate using one of two voltages. During write and other operations the wordline 104 may make use of the first voltage VDDCE 102 in order to achieve optimum bit cell write margin. During a read operation, the wordline 104 may make use of the second voltage VDDWL (shown at point 204). Depending on operating conditions, it is also possible that the wordline 104 may make use of the second voltage VDDWL for write operations. The choice of VDDWL or VDDCE for wordline 104 during a write operation is made depending on the tradeoff between optimum bit cell write margin and the design simplicity of maintaining the same wordline 104 voltage for both read and write operations. As described above, the second voltage VDDWL may be lower than the first voltage VDDCE 102. How much lower may essentially be determined by the ratio of two capacitances 232 and 234. The timing of the transition between the two voltages VDDCE 102 and VDDWL may be controlled by the two switches 222 and 224p.

In the illustrated embodiment, the apparatus 200 may include a wordline driver 224 (illustrated as an inverter 224) that is placed between the ground voltage and a point 204 representing the second voltage VDDWL. The wordline driver 224 may output the wordline signal 104, when the input wordline signal 214 is applied to it (e.g., via the inverter 224's gate pins).

In the illustrated embodiment, a switch or transistor 222 may be placed in between the first voltage VDDCE 102 and the point 204 representing the second voltage VDDWL. In such an embodiment, the switch 222 may dynamically connect or disconnect the wordline driver 224 with the first voltage VDDCE 102.

In the illustrated embodiment, the switch 222 may be controlled (e.g., via an input to its gate pin) by a control or gate enable signal 212. The apparatus 200 may include one or more control or logic circuits 290 that generate this gate enable signal 212. The gate enable signal 212 may be generated based, at least in part, by a clock signal 202.

Likewise, the input wordline signal 214 may be generated based upon the clock signal 202. In addition a read enable signal 206 may be input to the control logic 290. This read enable signal 206 may indicate that a read operation is to occur and which bit cell is to be read from. The read enable signal 206 may be gated by the second switch 291 included within the control logic 290.

Figure 3:
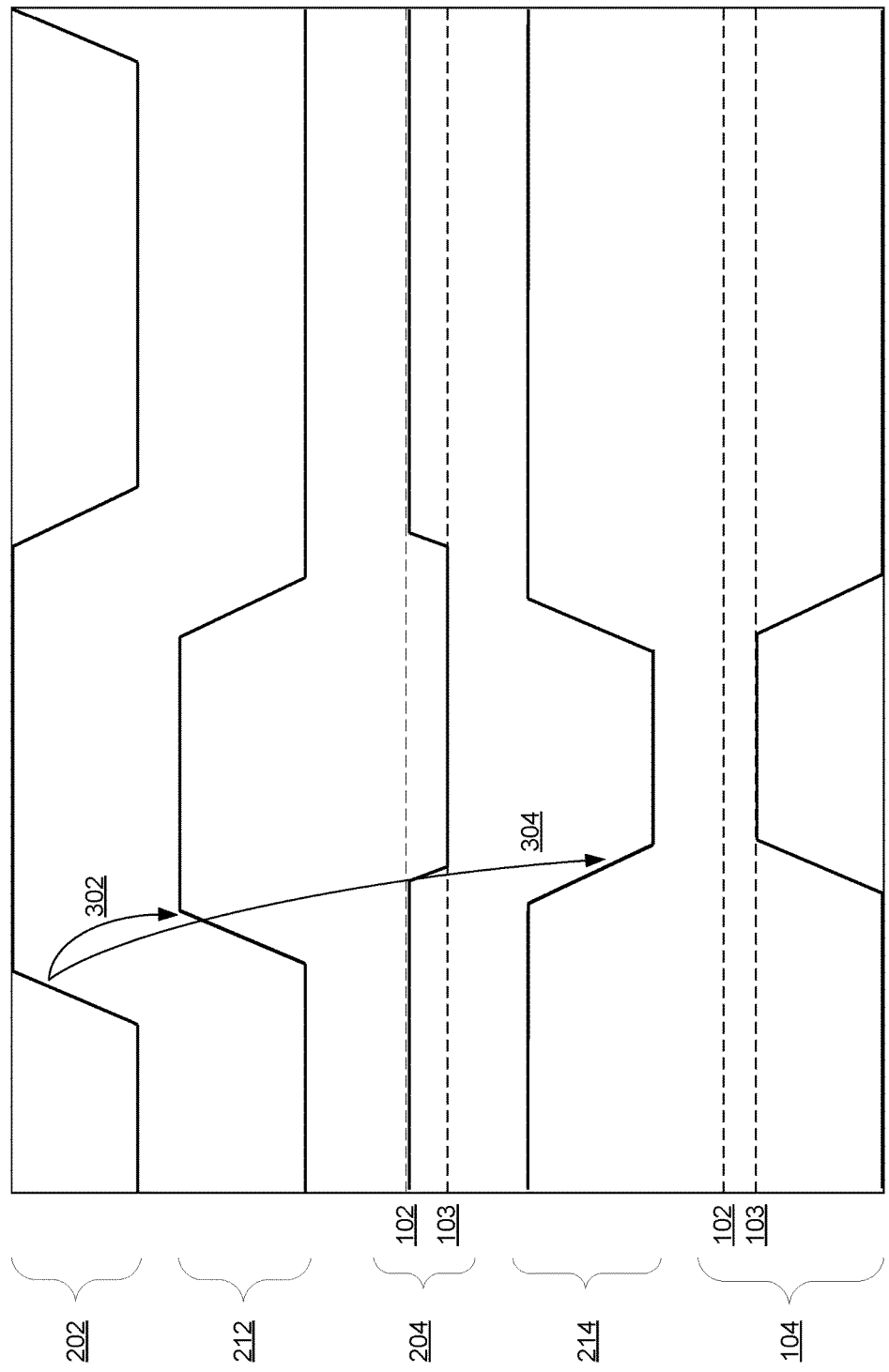
FIG. 3 is a waveform diagram of an example embodiment of an apparatus in accordance with the disclosed subject matter.

The timing of the apparatus 200 when a read operation is about to occur is discussed in reference to FIG. 3. FIG. 3 is a waveform diagram of an example embodiment of an apparatus (e.g., that of FIG. 2) in accordance with the disclosed subject matter.

When a read operation is about to occur, the switch 222 between voltages VDDCE 102 and point 204 is triggered by the rising edge of the clock signal 202. This is unusual as traditionally power gate transistor 222 is not controlled by a clock signal 202.

In response to the rising edge to the clock signal 202, the gate enable signal 212 "turns off" the switch 222 (as shown by arrow 302). When the switch 222 is turned on, the point 204 representing the second voltage VDDWL was substantially equal to the first voltage VDDCE 102. Turning off the switch 222 disconnects the point 204 from the first voltage VDDCE 102, and allows the point 204 to find its own voltage once switch 224p is turned on to allow a conductive path from point 204 to wordline 104. Switch 224p is turned on after wordline signal 214 is asserted (i.e. wordline signal 214 transitions from a high voltage to a low voltage).

This voltage for point 204 is substantially determined by the first capacitance $C_{VDDWL}$ 232 and the second capacitance $C_{WL}$ 234. This voltage is less than the first voltage VDDCE 102 (e.g., 85-90% of VDDCE 102), as described above. In FIG. 3, the voltage at the point 204 is shown transitioning from the first voltage VDDCE 102 (illustrated by the higher dotted line) to the second voltage VDDWL 103 (illustrated by the second, lower dotted line).

The input wordline signal 214 may be applied to the wordline driver 224. This input wordline signal 214 may then be converted (e.g., via inversion) to the wordline signal 104. The wordline signal 104 may have substantially the same voltage as that powering the wordline driver 224, which at this time is the second voltage VDDWL 103.

The wordline signal 104 may then go on to power the wordline of a bit cell (e.g., the bit cell of FIG. 1). As the voltage of the wordline is less than that of the first voltage VDDCE 102, the pass gate of the bit cell may not be so strongly turned on that a read disturb error occurs.

In the illustrated embodiment, the timing of the gate enable signal 212 and the input wordline signal 214 may be important. The gate enable signal 212 may transition from a low voltage to a high voltage such that the point 204 has been disconnected from the first voltage VDDCE 102. Once the gate enable signal 212 transitions high, the input wordline signal 214 may then transition from a high voltage to a low voltage such that the switch 224p turns on to enable a conductive path from the point 204 to the wordline 104. The above-described timing of gate enable signal 212 with respect to timing of input wordline signal 214 is important in order to achieve the desired value VDDWL for point 204. The transition of input wordline signal 214 from a high voltage to a low voltage has two effects. The first effect is to ensure that point 204 settles at voltage VDDWL.

The second effect is to ensure that wordline 104 transitions from a low voltage to a higher voltage value equal to or substantially close to voltage VDDWL. It should be recognized that correctly managing the relative timing between gate enable signal 212 and the input wordline signal 214 is essential in order to achieve the correct charge sharing behavior between capacitance 232 and capacitance 234. The delay between low-to-high transition for gate enable signal 212 and high-to-low transition for the wordline input signal 214 is represented between arrows 302 and 304.

In various embodiments, to insure the proper delay between the two signals 212 and 214 the timing may be based upon the clock signal 202. In the illustrated embodiment, the delay between the rising edge of the clock signal 202 and the gate enable signal 212 may be 7 logic gates worth of delay, whereas the delay between the rising edge of the clock signal 202 and the input wordline signal 214 may be 8 logic gates worth of delay. It is understood that the above is merely one illustrative example to which the disclosed subject matter is not limited.

Returning to FIG. 2, the value of the second voltage (at point 204) may be essentially controlled by the ratio of the first capacitance $C_{VDDWL}$ 232 and the second capacitance $C_{WL}$ 234. More specifically the second voltage VDDWL may be dictated by the equation below:

$$VDDWL = VDDCE\left(\frac{C_{VDDWL}}{C_{VDDWL} + C_{WL}}\right)$$

Or to simplify, the following ratio:

$$\left(\frac{C_{VDDWL}}{C_{WL}}\right)$$

In various embodiments, the capacitance $C_{VDDWL}$ 232 may include the interconnect capacitance of the VDDWL 204 network, and the junction capacitance seen at the source pin of the p-channel field-effect transistor (pFET) 224p of the wordline driver 224. In various embodiments, the total source pin pFET capacitance may include the sum of all pFET junction capacitances seen in a network of wordline drivers (such as those of FIGS. 4 and 5).

In various embodiments, the capacitance $C_{WL}$ 234 may include the capacitance of the wordline driver network (such as those of FIGS. 4 and 5), and the total capacitance of all the bit cell pass gates driven by wordline 104. In such an embodiment, to achieve a second voltage VDDWL (at point 204) that is approximately 90% of the first voltage VDDCE, the capacitances may be tuned such that the capacitance $C_{VDDWL}$ 232 is approximately nine times larger than the capacitance $C_{WL}$ 234.

In such an embodiment, the creation of a second or lower voltage VDDWL may be done without the need for complex analog circuitry. Instead, the second voltage VDDWL is created and determined by charge sharing between a plurality of capacitances. Further, the plurality of capacitances may be tuned to create a desired second voltage VDDWL. In some embodiments, the capacitances may be dynamically tuned via additional switches (not shown) and specifically chosen capacitance values. It is understood that the above is merely one illustrative example to which the disclosed subject matter is not limited.

Figure 4:
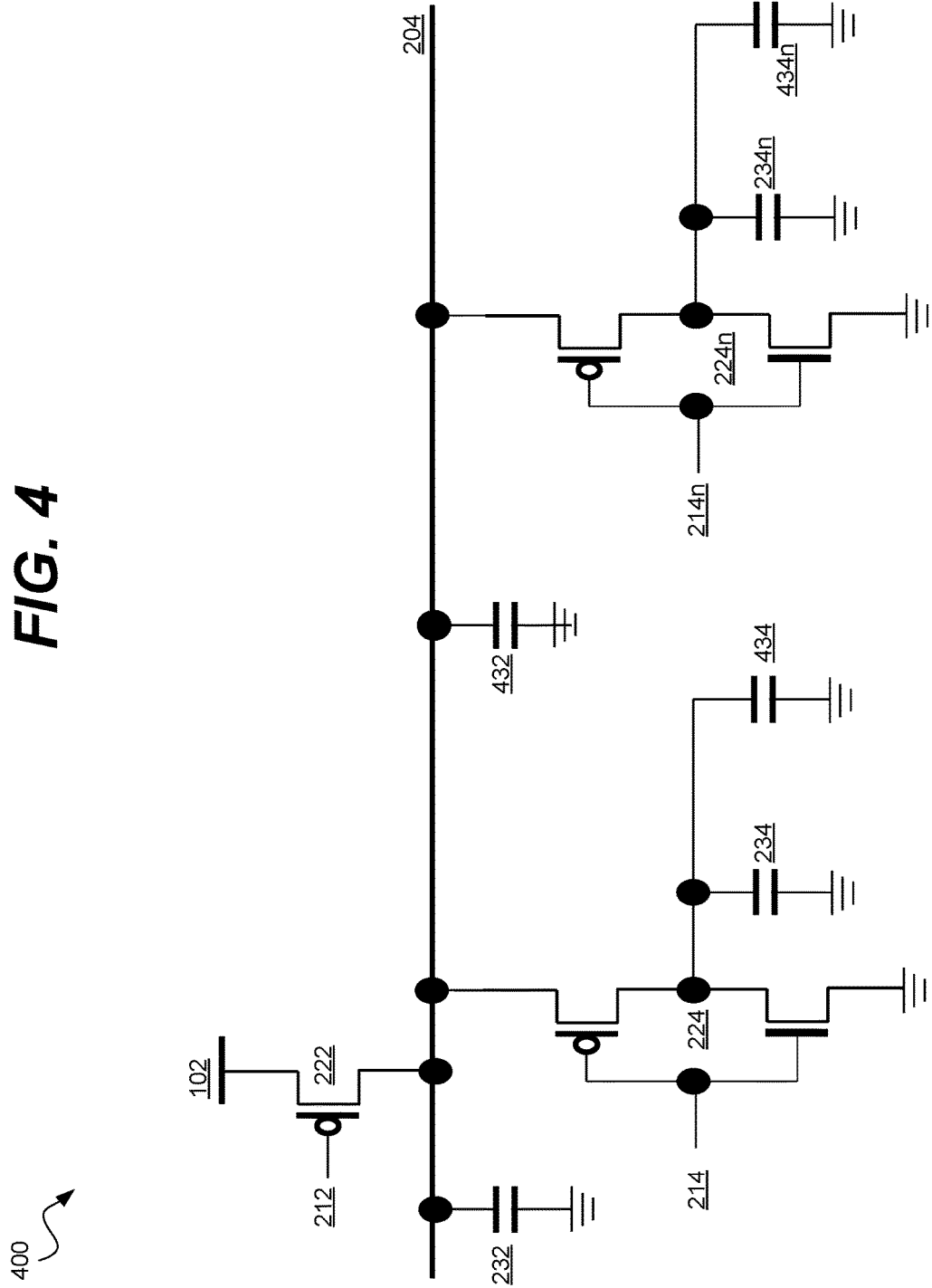
FIG. 4 is a circuit diagram of an example embodiment of an apparatus in accordance with the disclosed subject matter.

FIG. 4 is a circuit diagram of an example embodiment of an apparatus 400 in accordance with the disclosed subject matter. In the illustrated embodiment, the apparatus 400 may include a wordline driver network having a plurality of wordline drivers. This wordline driver network may generate the wordline signal(s) that control the pass gates of their respective bit cells (e.g., the bit cell 100 of FIG. 1).

In the illustrated embodiment, the wordline network 400 may include a plurality of wordline drivers 224 and 224n. While only two wordline drivers are shown, it is understood that the network may include any number of wordline drivers 224. For example a network 400 having 256 wordline drivers 224 would not be uncommon; although, it is understood that the above are merely a few illustrative examples to which the disclosed subject matter is not limited.

In such an embodiment, each wordline driver 224 may include its own input wordline signal 214 and 214n, inverter, and capacitance $C_{WL}$ 234 and 234n. In various embodiments, each wordline driver 224 may be turned on or off independently. In various embodiments, each wordline driver 224 may drive its own respective set of bit cells (such as that of FIG. 1).

In the illustrated embodiment, the capacitance $C_{VDDWL}$ 232 may include the capacitance of the VDDWL 204 network, and the junction capacitance seen at the source pin of the p-channel field-effect transistor (pFET) of all the wordline drivers 224 and 224n. In various embodiments, the pFET junction capacitance may include the sum of all pFET junction capacitances seen in a network of wordline drivers 224 and 224n.

Figure 5:
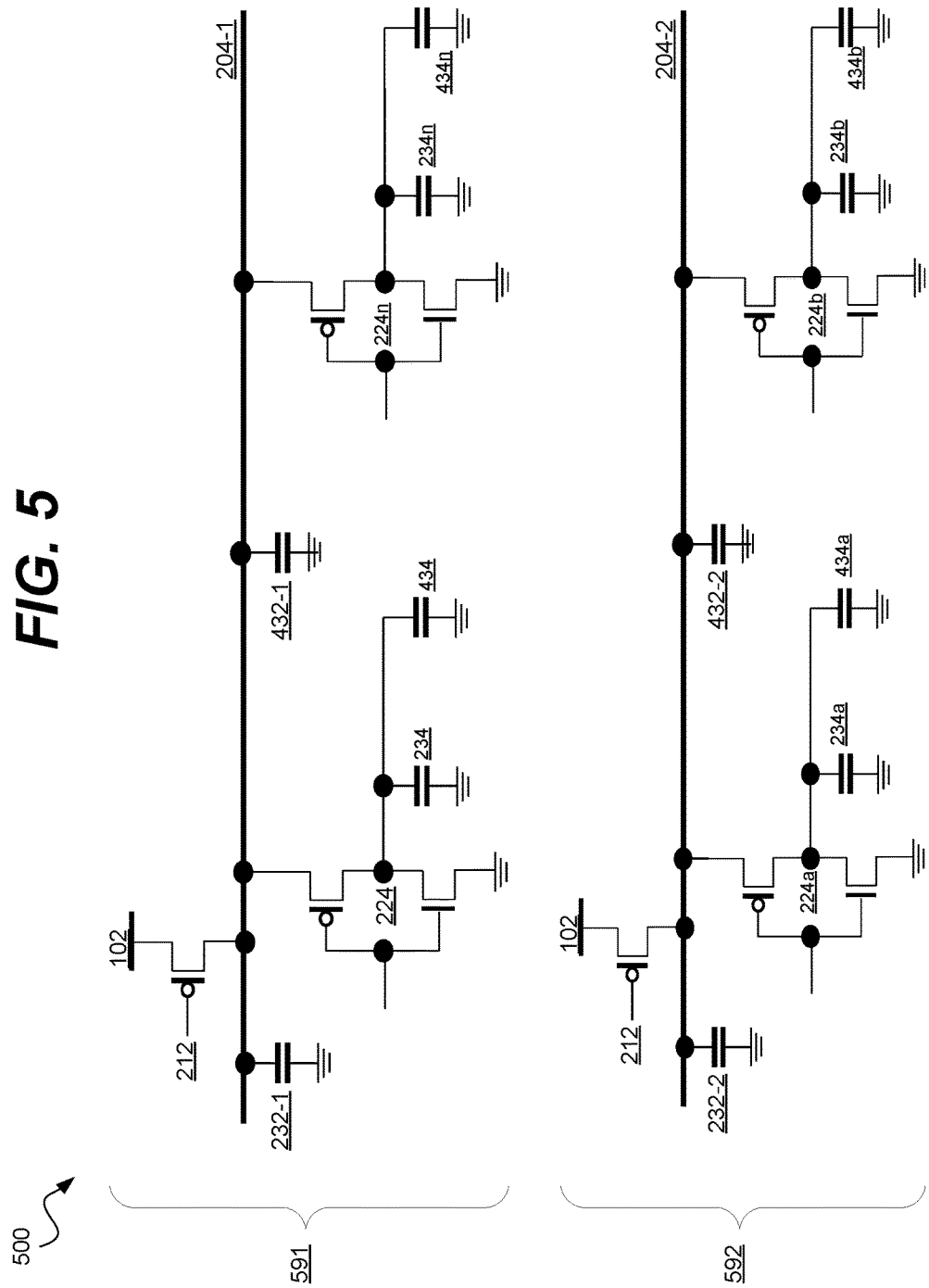
FIG. 5 is a circuit diagram of an example embodiment of an apparatus in accordance with the disclosed subject matter.

In the illustrated embodiment, if the natural capacitances 232 and 234 do not provide the desired capacitance ratio (and hence the desired VDDWL), dummy capacitances 432 and/or 434 and 434n may be added to the network 400. As shown in FIG. 5, some capacitances may be reduced to achieve the desired capacitance ratio.

In the illustrated embodiment, if the capacitance ratio of $C_{VDDWL}/C_{WL}$ is too low (i.e. the voltage VDDWL is not high enough), a dummy or artificial capacitance $C_{VDDWL\_Dummy}$ 432 may be added to the network 400. This may increase the capacitance ratio and raise the second voltage VDDWL to a more desirable level.

In the illustrated embodiment, if the capacitance ratio of $C_{VDDWL}/C_{WL}$ is too high (i.e. the voltage VDDWL is too high), a dummy or artificial capacitance $C_{WL\_Dummy}$ 434 and 434n may be added to each wordline driver 224. This may decrease the capacitance ratio and lower the second voltage VDDWL to a more desirable level (e.g., one that does not cause a read disturb error).

FIG. 5 is a circuit diagram of an example embodiment of an apparatus 500 in accordance with the disclosed subject matter. In the illustrated embodiment, the apparatus 500 may include a plurality of wordline driver networks 591 and 592, each having a plurality of wordline drivers. Each wordline driver may generate the wordline signal(s) that control the pass gates of their respective bit cells (e.g., the bit cell 100 of FIG. 1).

As described above, the capacitance ratio may be tuned by adding more or dummy capacitors. However, the capacitance ratio may also be tuned by lowering or reducing the capacitance (specifically capacitance $C_{VDDWL}$) of the wordline driver network. In the illustrated embodiment, this is accomplished by dividing the wordline driver network into two (or more) separate networks 591 and 592.

By way of example, assume one had a single, unified wordline network (not shown) that included essentially the same elements as the previously described wordline network of FIG. 4 but with more wordline drivers and therefore a higher capacitance $C_{VDDWL}$ 232. In this example the single or unified wordline network may include four wordline drivers 224, 224n, 224a, and 224b. The pFET source capacitance of all four wordline drivers 224, 224n, 224a, and 224b would all be included in the capacitance $C_{VDDWL}$ 232. The capacitance ratio may be too large, and the second voltage VDDWL may be too high.

However, if one breaks the single, unified wordline network into multiple wordline networks 591 and 592, each wordline network 591 and 592 may have a lower number of wordline drivers and thence a lower capacitance $C_{VDDWL}$ 232-1 and 232-2. Therefore, the capacitance ratio and second voltages VDDWL for each wordline network 591 & 592 may be lowered.

In the illustrated embodiment, the first wordline network 591 may include essentially the same elements as the previously described unified wordline network (such as, the switch 212), but only two (or a smaller number) of wordline drivers 224 and 224n. In this example, only the pFET junction capacitance of the two wordline drivers 224 and 224n would be included in the capacitance $C_{VDDWL}$ 232-1. Therefore, this new capacitance $C_{VDDWL}$ 232-1 would be smaller than the capacitance $C_{VDDWL}$ 232 of the unified wordline network (which included 4 wordline drivers). Likewise with the second wordline network 592 that only includes the wordline drivers 224a and 224b, and therefore only their two pFET junction capacitances.

In the illustrated embodiment, respective dummy or artificial capacitances $C_{VDDWL\_Dummy}$ 432-1 and 432-2 may be added to the networks 591 and 592. In various embodiments, these dummy capacitances $C_{VDDWL\_Dummy}$ 432-1 and 432-2 may differ in size. In some embodiments, this may be because of desire to have differing second voltages VDDWL at points 204-1 and 204-2. In another embodiment, this may be because of differences in the capacitances $C_{VDDWL}$ 232-1 and 232-2 (e.g., the wordline networks may include a different or unequal number of wordline drivers). It is understood that the above are merely a few illustrative examples to which the disclosed subject matter is not limited.

Likewise, the wordline drivers 224, 224n, 224a, and 224b, may each have (or not have) differing capacitances $C_{WL\_Dummy}$. In some embodiments, the capacitances $C_{WL\_Dummy}$ may be set for the entire wordline network 591 and 592. In another embodiment, the capacitances $C_{WL\_Dummy}$ may be set individually by wordline driver. It is understood that the above are merely a few illustrative examples to which the disclosed subject matter is not limited.

In some embodiments, the disclosed subject matter may be implemented with little impact to the area consumption of the circuit's design. In such an embodiment, the switches 222 may be placed within the empty space in the memory array. Or, in another embodiment, the switches 222 may be placed where switches used to gate power to the wordline drivers would have been placed had the disclosed subject matter not been used. In such an embodiment, any additional control logic (e.g., to turn the switch 222 on and off at the correct time) may be minimal and included within any existing control logic. Likewise, in yet another embodiment, any dummy capacitances may be placed within the empty space in the memory array. It is understood that the above are merely a few illustrative examples to which the disclosed subject matter is not limited.

Figure 6:
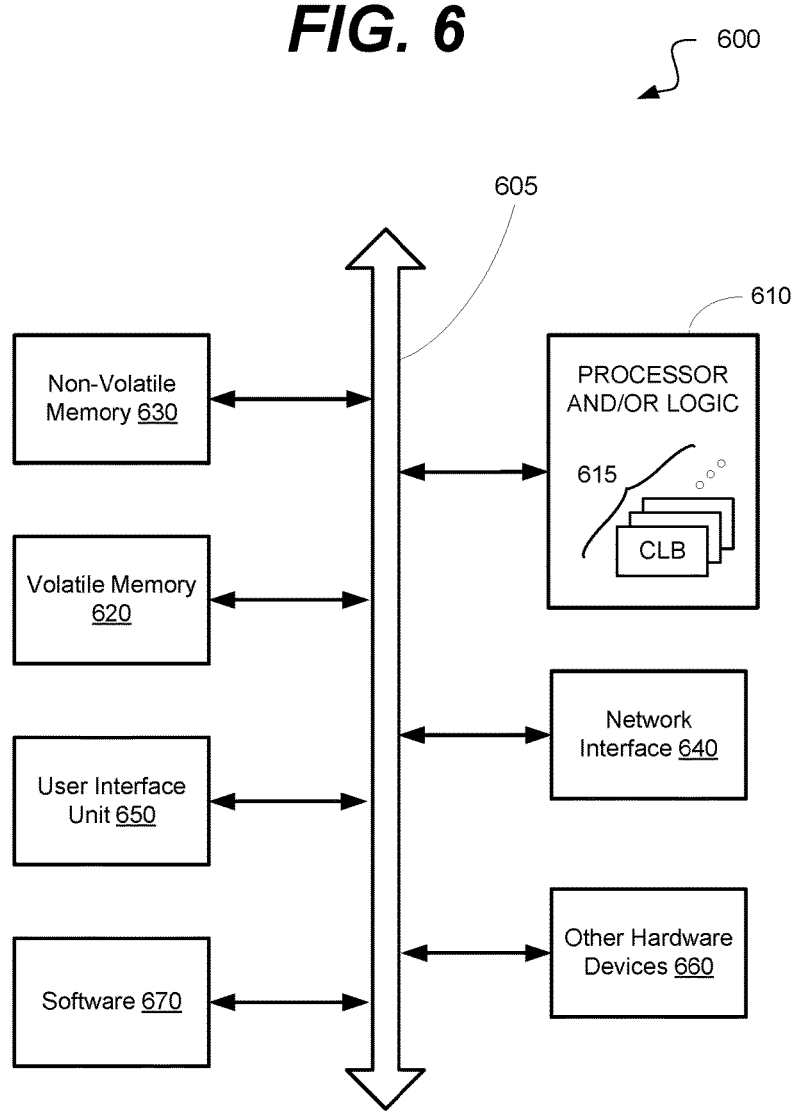
FIG. 6 is a schematic block diagram of an information processing system that may include devices formed according to principles of the disclosed subject matter.

FIG. 6 is a schematic block diagram of an information processing system 600, which may include semiconductor devices formed according to principles of the disclosed subject matter.

Referring to FIG. 6, an information processing system 600 may include one or more of devices constructed according to the principles of the disclosed subject matter. In another embodiment, the information processing system 600 may employ or execute one or more techniques according to the principles of the disclosed subject matter.

In various embodiments, the information processing system 600 may include a computing device, such as, for example, a laptop, desktop, workstation, server, blade server, personal digital assistant, smartphone, tablet, and other appropriate computers, and so on or a virtual machine or virtual computing device thereof. In various embodiments, the information processing system 600 may be used by a user (not shown).

The information processing system 600 according to the disclosed subject matter may further include a central processing unit (CPU), logic, or processor 610. In some embodiments, the processor 610 may include one or more functional unit blocks (FUBs) or combinational logic blocks (CLBs) 615. Additionally, processor 610 can also include embedded Static Random Access Memory (SRAM) to fulfill functions such as level-1, level-2, and level-3 caches. In such an embodiment, a combinational logic block may include various Boolean logic operations (e.g., NAND, NOR, NOT, XOR, and so on), stabilizing logic devices (e.g., flip-flops, latches, and so on), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 600 according to the disclosed subject matter may further include a volatile memory 620 (e.g., a Random Access Memory (RAM), and so on). The information processing system 600 according to the disclosed subject matter may further include a non-volatile memory 630 (e.g., a hard drive, an optical memory, a NAND or Flash memory, and so on). In some embodiments, the volatile memory 620, the non-volatile memory 630, or a combination or portions thereof may be referred to as a "storage medium". In various embodiments, the volatile memory 620 and/or the non-volatile memory 630 may be configured to store data in a semi-permanent or substantially permanent form.

In various embodiments, the information processing system 600 may include one or more network interfaces 640 configured to allow the information processing system 600 to be part of and communicate via a communications network. Examples of a Wi-Fi protocol may include, but are not limited to, Institute of Electrical and Electronics Engineers (IEEE) 802.11g, IEEE 802.11n, and so on. Examples of a cellular protocol may include, but are not limited to: IEEE 802.16m (a.k.a. Wireless-MAN (Metropolitan Area Network) Advanced), Long Term Evolution (LTE)

Advanced), Enhanced Data rates for GSM (Global System for Mobile Communications) Evolution (EDGE), Evolved High-Speed Packet Access (HSPA+), and so on. Examples of a wired protocol may include, but are not limited to, IEEE 802.3 (a.k.a. Ethernet), Fibre Channel, Power Line communication (e.g., HomePlug, IEEE 1901, and so on), and so on. It is understood that the above are merely a few illustrative examples to which the disclosed subject matter is not limited.

The information processing system 600 according to the disclosed subject matter may further include a user interface unit 650 (e.g., a display adapter, a haptic interface, a human interface device, and so on). In various embodiments, this user interface unit 650 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 600 may include one or more other devices or hardware components 660 (e.g., a display or monitor, a keyboard, a mouse, a camera, a fingerprint reader, a video processor, and so on). It is understood that the above are merely a few illustrative examples to which the disclosed subject matter is not limited.

The information processing system 600 according to the disclosed subject matter may further include one or more system buses 605. In such an embodiment, the system bus 605 may be configured to communicatively couple the processor 610, the volatile memory 620, the non-volatile memory 630, the network interface 640, the user interface unit 650, and one or more hardware components 660. Data processed by the processor 610 or data inputted from outside of the non-volatile memory 630 may be stored in either the non-volatile memory 630 or the volatile memory 620.

In various embodiments, the information processing system 600 may include or execute one or more software components 670. In some embodiments, the software components 670 may include an operating system (OS) and/or an application. In some embodiments, the OS may be configured to provide one or more services to an application and manage or act as an intermediary between the application and the various hardware components (e.g., the processor 610, a network interface 640, and so on) of the information processing system 600. In such an embodiment, the information processing system 600 may include one or more native applications, which may be installed locally (e.g., within the non-volatile memory 630, and so on) and configured to be executed directly by the processor 610 and directly interact with the OS. In such an embodiment, the native applications may include pre-compiled machine executable code. In some embodiments, the native applications may include a script interpreter (e.g., C shell (csh), AppleScript, AutoHotkey, and so on) or a virtual execution machine (VM) (e.g., the Java Virtual Machine, the Microsoft Common Language Runtime, and so on) that are configured to translate source or object code into executable code which is then executed by the processor 610.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, and so on). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
   a bit cell configured to store a bit of information;
   a first voltage configured to supply the bit cell with power; and
   a wordline driver configured to cause the bit to be read from the bit cell,
   wherein the wordline driver is configured to operate during a read operation at a second voltage that is lower than the first voltage, wherein the second voltage is determined by charge sharing between a plurality of capacitances, and a capacitance ratio that comprises a ratio of a wordline capacitance and a wordline-voltage capacitance, and
   wherein the wordline driver comprises a switch configured to disconnect the wordline driver from the first voltage before an input word line signal is applied to the wordline driver, and wherein the switch is responsive to a clock signal.

2. The apparatus of claim 1, wherein the wordline capacitance comprises:
   a wordline net capacitance, and
   one or more bit cell pass gate capacitances, wherein the one or more bit cells each comprises at least one bit cell pass gate.

3. The apparatus of claim 2, wherein the wordline net capacitance comprises at least one dummy wordline capacitor configured to adjust the capacitance ratio.

4. The apparatus of claim 3, wherein the wordline-voltage capacitance comprises:
   a wordline-voltage net capacitance, and
   a p-channel field-effect transistor (pFET) source capacitance, wherein the wordline driver includes a pFET.

5. The apparatus of claim 4, wherein the wordline-voltage net capacitance comprises at least one dummy wordline-voltage capacitor configured to adjust the capacitance ratio.

6. The apparatus of claim 1, wherein the switch changes state based upon a rising edge of the clock signal.

7. A method comprising:
   storing a bit of information within a bit cell at a first voltage;
   disconnecting, responsive to a clock signal, a wordline driver associated with the bit cell from the first voltage;
   activating the wordline driver after the wordline driver has been disconnected from the first voltage, wherein the wordline driver is activated by a second voltage that is less than the first voltage and determined by charge sharing between a plurality of capacitances, and a capacitance ratio that comprises a ratio of a wordline capacitance and a wordline-voltage capacitance; and
   transmitting, via a pass gate that is responsive to the wordline driver, the bit to a bitline.

8. The method of claim 7, wherein the wordline capacitance comprises:
   a wordline net capacitance, and
   one or more bit cell pass gate capacitances, wherein the one or more bit cells each comprises at least one bit cell pass gate.

9. The method of claim 8, wherein the wordline net capacitance comprises at least one dummy wordline capacitor configured to adjust a capacitance ratio.

10. The method of claim 8, wherein the wordline-voltage capacitance comprises:
    a wordline-voltage net capacitance, and
    a p-channel field-effect transistor (pFET) source capacitance, wherein the wordline driver includes a pFET.

11. The method of claim 7, wherein disconnecting comprises disconnecting the wordline driver in response to a rising edge of the clock signal.

12. An apparatus comprising:
    a plurality of bit cells each configured to store a respective bit of information;
    a first voltage configured to supply the plurality of bit cells with power; and
    a wordline driver network comprising:
        a plurality of wordline drivers each associated with one or more associated bit cells, and each configured to cause the bits stored by the associated bit cells to be output by the associated bit cells, wherein each wordline driver is configured to operate during a read operation at a second voltage that is lower than the first voltage, wherein the second voltage is determined by charge sharing between a plurality of capacitances, and a capacitance ratio that comprises a ratio of a wordline capacitance and a wordline-voltage capacitance, and
        a switch configured to disconnect the plurality of wordline drivers from the first voltage before an input word line signal is applied to at least one wordline driver, and wherein the switch is responsive to a clock signal.

13. The apparatus of claim 12, wherein the wordline driver network comprises a plurality of sub-networks such that a wordline-voltage capacitance of each sub-network is lower than if the wordline driver network was aggregated into a single network.

14. The apparatus of claim 12, wherein the wordline capacitance comprises at least one dummy wordline capacitor configured to adjust the capacitance ratio and arranged in parallel to an output of a wordline driver.

15. The apparatus of claim 12, wherein the wordline-voltage capacitance comprises at least one dummy wordline-voltage capacitor configured to adjust the capacitance ratio, and arranged in parallel with a wordline driver, such that the dummy wordline-voltage capacitor is disconnected from the first voltage by the switch.

16. The apparatus of claim 12, wherein the switch changes state based upon an edge of the clock signal.

17. The apparatus of claim 12, wherein the switch and an activated wordline driver are configured to change state within a single clock cycle, and
    wherein the switch is configured to change state before the wordline driver.

* * * * *